United States Patent
Cudak et al.

(10) Patent No.: US 9,690,651 B2
(45) Date of Patent: Jun. 27, 2017

(54) CONTROLLING A REDUNDANT ARRAY OF INDEPENDENT DISKS (RAID) THAT INCLUDES A READ ONLY FLASH DATA STORAGE DEVICE

(71) Applicant: Lenovo Enterprise Solutions (Singapore) Pte. Ltd., Singapore (SG)

(72) Inventors: Gary D. Cudak, Wake Forest, NC (US); Christopher J. Hardee, Raleigh, NC (US); Srihari V. Angaluri, Raleigh, NC (US); Adam Roberts, Moncure, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 62 days.

(21) Appl. No.: 14/718,560

(22) Filed: May 21, 2015

(65) Prior Publication Data

US 2016/0342465 A1 Nov. 24, 2016

(51) Int. Cl.
*G06F 11/10* (2006.01)
*G06F 3/06* (2006.01)
*G11C 29/52* (2006.01)

(52) U.S. Cl.
CPC .......... *G06F 11/1068* (2013.01); *G06F 3/064* (2013.01); *G06F 3/0619* (2013.01); *G06F 3/0688* (2013.01); *G06F 3/0689* (2013.01); *G11C 29/52* (2013.01)

(58) Field of Classification Search
CPC .. G06F 11/1068; G06F 3/0689; G06F 3/0619; G06F 3/064; G06F 3/0688; G11C 29/52
See application file for complete search history.

(56) References Cited

U.S. PATENT DOCUMENTS

| | | | |
|---|---|---|---|
| 6,339,810 B1 | 1/2002 | Basham et al. | |
| 8,495,432 B2* | 7/2013 | Dickens | G06F 11/073 714/42 |
| 2012/0284467 A1 | 11/2012 | Bish et al. | |
| 2015/0378816 A1* | 12/2015 | Kawamura | G06F 3/06 714/766 |

OTHER PUBLICATIONS

GPTO, "Examination Report", May 30, 2016, 7 pages.

* cited by examiner

*Primary Examiner* — April Y Blair
*Assistant Examiner* — Rong Tang
(74) *Attorney, Agent, or Firm* — Jeffrey L. Streets

(57) ABSTRACT

A method is provided for controlling a redundant array of independent disks (RAID). The method comprises a computer system writing data to a RAID and reading data from the RAID, wherein the RAID includes a controller and a plurality of data storage devices, including a flash data storage device. The method further comprises the controller detecting whether or not the flash data storage device is in read-only mode, and the controller preventing attempts to write data to the flash data storage device in response to detecting that the flash data storage device is in read-only mode. Optionally, when the flash data storage device is in read-only mode, the controller may redirect writes intended for the flash data storage device to empty data storage space on another data storage device or cache memory, or modify the parity stripe of a major stripe in view of the data intended to be written.

20 Claims, 5 Drawing Sheets

CONTROLLING A REDUNDANT ARRAY OF INDEPENDENT DISKS (RAID) THAT INCLUDES A READ ONLY FLASH DATA STORAGE DEVICE

BACKGROUND

Field of the Invention

The present invention relates to the management of data storage, specifically including the use of a redundant array of independent disks.

Background of the Related Art

In modern computer systems, the need for data reliability and input/output performance has led to the development of a series of data storage schemes that divide and replicate data among multiple data storage devices. Such a storage scheme is commonly referred to as a Redundant Array of Independent Disks (RAID). A RAID system combines physical data storage devices, such as hard disk drives, into a single logical unit by using either special hardware or software. A hardware solution will typically be designed to present itself to the attached system as a single logical device or drive, such that the operating system is unaware of the technical workings of the underlying array. Alternatively, a software solution may be implemented in an operating system, and would similarly present the RAID drive to applications as a single device or drive. The minimum number of drives and the level of data reliability depend on the type of RAID scheme that is implemented.

Originally there were five RAID levels, where different RAID levels use one or more techniques referred to as mirroring, striping and error correction. Mirroring involves the copying of data to more than one disk, striping involves the spreading of data across more than one disk, and error correction involves storing redundant data (parity) to allow problems to be detected and possibly fixed.

A RAID 0 array spreads data evenly across two or more disks with no parity. Accordingly, it can be said that RAID 0 provides striping without any redundancy. RAID 0 is appropriate for high performance where there is little or no concern over data integrity.

A RAID 1 array provides a complete and exact copy of data on two or more disks. Accordingly, RAID 1 includes complete redundancy or mirroring. The performance of RAID 1 is good, and may optionally include duplexing that enables independent reading of different sectors of the disks to increase speed further. The data integrity of RAID 1 is also good, due to the complete copy maintained in the companion disk.

In general, RAID 3 provides byte-level striping with a dedicated parity disk, RAID 4 provides block-level striping with a dedicated parity disk, and RAID 5 provides block-level striping with parity data distributed across all member disks. RAID 5 has achieved popularity due to its low cost of redundancy. Generally, RAID 5 is implemented with hardware support for parity calculations. A minimum of three disks is generally required for a complete RAID 5 configuration. RAID 5 offers a balance between price and performance for most commercial server workloads, and provides single-drive fault tolerance by implementing a technique called single equation single unknown. The checksum information is evenly distributed over all drives, and checksum update operations are evenly balanced within the array.

During read operations, parity blocks are typically not read since this would be unnecessary overhead and would diminish performance. The parity blocks are read, however, when a read of a data sector results in a CRC error (each sector is protected by a CRC as well). In this case, the sector in the same relative position within each of the remaining data blocks in the stripe and within the parity block in the stripe are used to reconstruct the errant sector. The CRC error is thus hidden from the main computer. Likewise, should a disk fail in the array, the parity blocks from the surviving disks are combined mathematically with the data blocks from the surviving disks to reconstruct the data on the failed drive "on the fly". However, in RAID 5, where there is a single parity block per stripe, the failure of a second drive results in total data loss. The foregoing discussion of RAID levels is intended to provide general examples of features included in different RAID levels, and is not intended be a comprehensive list or description of RAID levels.

Regardless of the RAID level, the RAID stack has been built around the use of mechanical hard disk drive. However, flash data storage devices are increasingly being used in various applications. Flash data storage devices are faster and can provide response times that are impossible to achieve with mechanical hard disk drives. However, flash data storage devices operate differently than mechanical hard disk drives in ways that can lead to operational problems. For example, flash data storage devices have very measurable limits to the number of times the device can be written to. To allow for the user to still access their data, a flash data storage device will enter into a read-only mode such that computer systems can still read the data from the device even though the system can no longer write data to the device. This is problematic in a RAID array, since the RAID controller will defunct a drive when attempted writes fail. Furthermore, such writes can occur in situations such as background data scrubbing while the user isn't even trying to access data. Also, the act of booting an operating system in order to attempt to rescue data from the device can trigger writes that will cause the device to fail and get marked as being defunct.

BRIEF SUMMARY

One embodiment of the present invention provides a method of controlling a redundant array of independent disks (RAID). The method comprises a computer system writing data to a redundant array of independent disks and reading data from the redundant array of independent disks, wherein the redundant array of independent disks includes a controller and a plurality of data storage devices, and wherein the plurality of data storage devices includes a flash data storage device. The method further comprises the controller detecting whether or not the flash data storage device is in read-only mode, and the controller preventing attempts to write data to the flash data storage device in response to detecting that the flash data storage device is in read-only mode.

Another embodiment of the present invention provides a computer program product for operating a redundant array of independent disks including a controller and a plurality of data storage devices, wherein the plurality of data storage devices includes a flash data storage device. The computer program product comprises a computer readable storage medium having program instructions embodied therewith, the program instructions executable by a processor to cause the processor to perform a method. The method in accordance with one embodiment may comprise communicating with a computer system that writes data to a redundant array of independent disks and reads data from the redundant array of independent disks, the controller detecting whether or not the flash data storage device is in read-only mode, and the controller preventing attempts to write data to the flash data storage device in response to detecting that the flash data storage device is in read-only mode.

BRIEF DESCRIPTION OF THE SEVERAL
VIEWS OF THE DRAWINGS

Figure 4A:
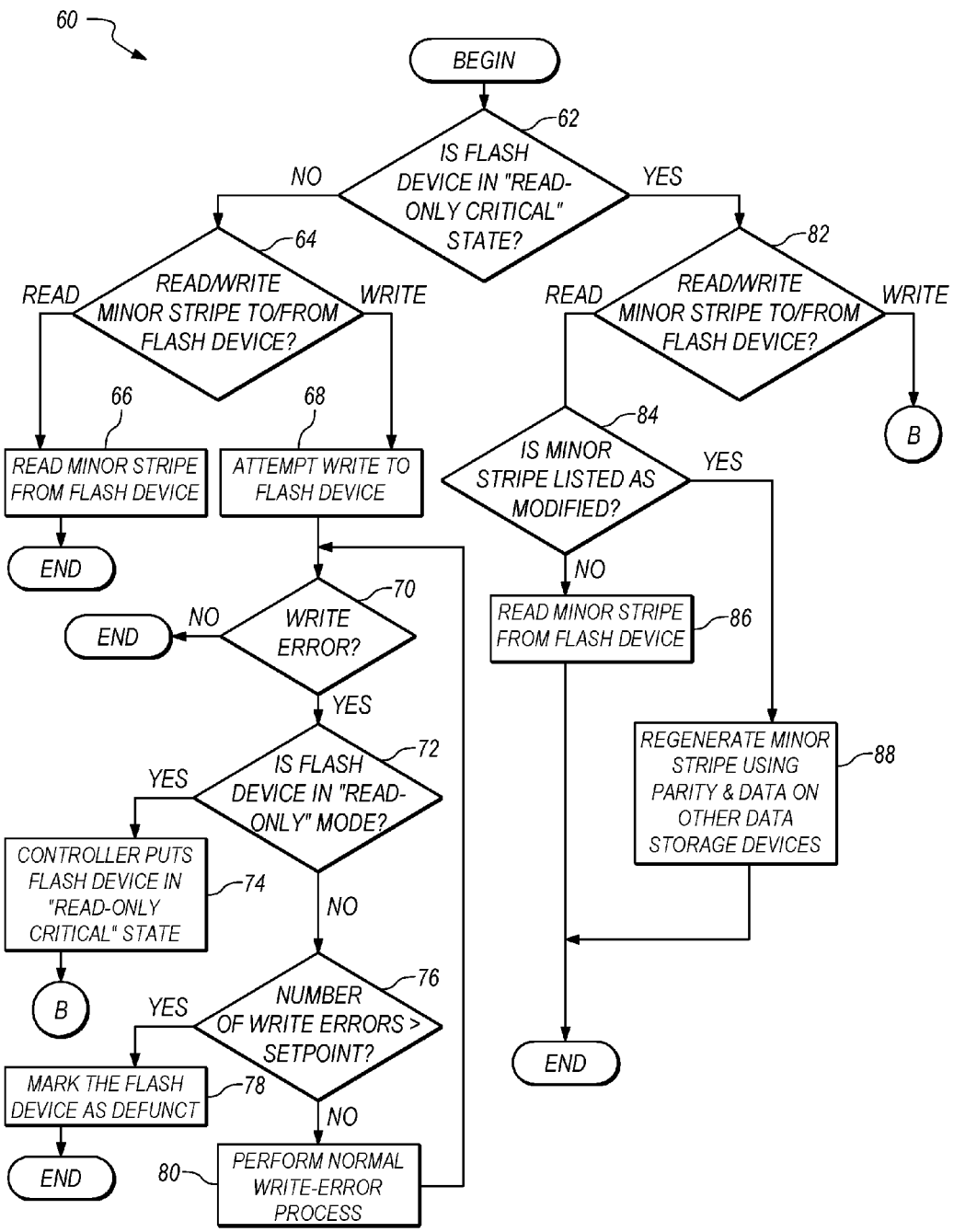
Figure 4B:
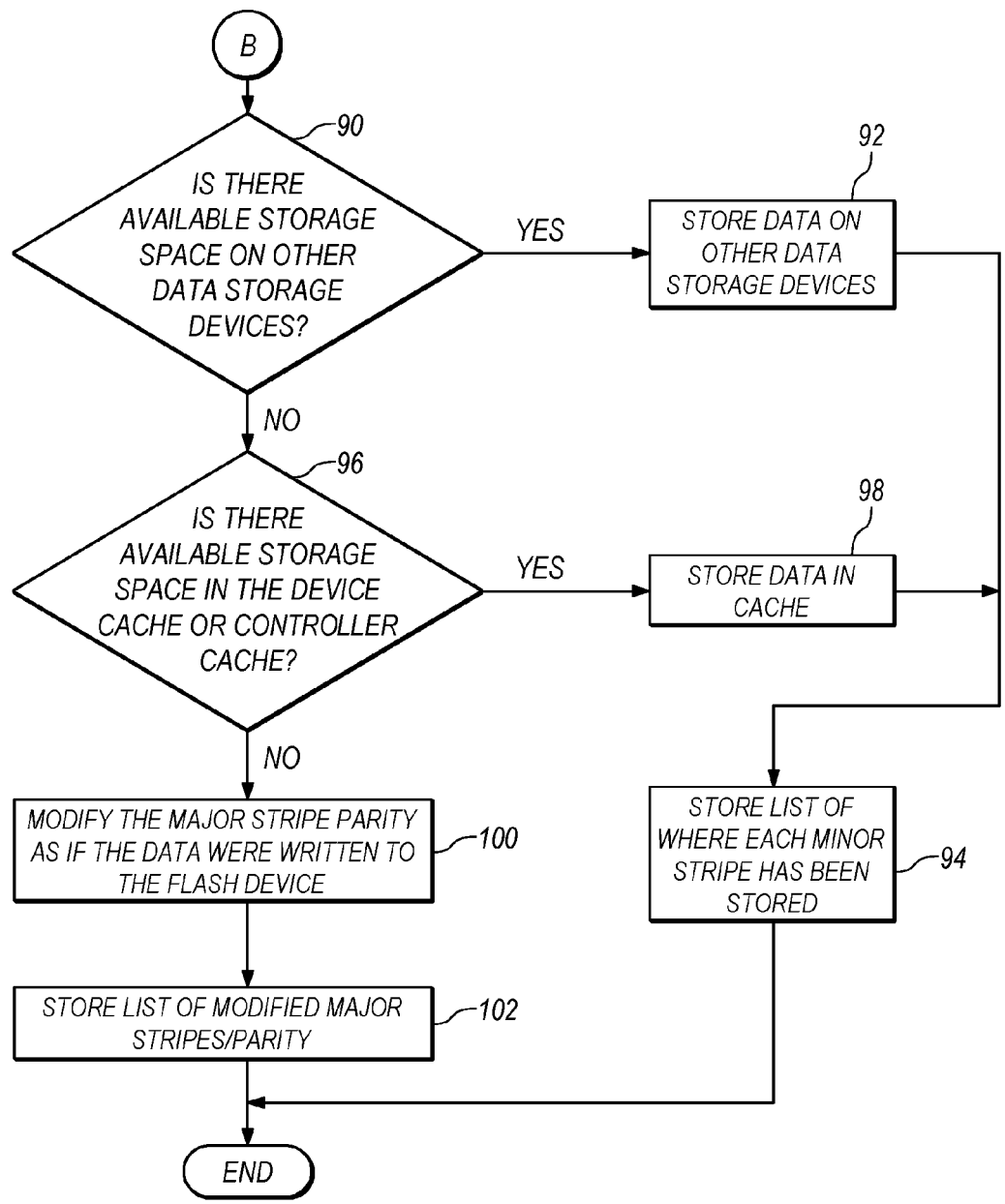

FIGS. 4A-B are flowcharts of a method of handling read and write operations involving a flash data storage device in a redundant array of independent disks (RAID).

DETAILED DESCRIPTION

One embodiment of the present invention provides a method of controlling a redundant array of independent disks (RAID). The method comprises a computer system writing data to a redundant array of independent disks and reading data from the redundant array of independent disks, wherein the redundant array of independent disks includes a controller and a plurality of data storage devices, and wherein the plurality of data storage devices includes a flash data storage device. The method further comprises the controller detecting whether or not the flash data storage device is in read-only mode, and the controller preventing attempts to write data to the flash data storage device in response to detecting that the flash data storage device is in read-only mode. However, the flash data storage device is not marked as being defunct as a result of being in the read-only mode, and the RAID array is able to continue to store data across the plurality of data storage devices. The flash data storage device may include a register set that stores an indication whether or not the flash storage device is in read-only mode. Optionally, the plurality of data storage devices may include at least one hard disk drive.

In one option, the controller may redirect writes intended for the flash data storage device to empty data storage space on another data storage device within the plurality of data storage devices in response to the flash data storage device being in read-only mode. When the data is written to the empty data storage space, the data is associated with the minor stripe of the flash data storage device to which the write was original intended or directed.

In a similar option, the controller may redirect writes intended for the flash data storage device to cache memory that is accessible to the controller in response to the flash data storage device being in read-only mode. The cache memory may be directly attached or associated with the controller or the cache memory may be part of the flash data storage device.

In yet another option, the controller may modify the parity stripe of a major stripe as if the write to the flash data storage device had occurred, and the controller storing a list of each major stripe where a parity stripe was modified due to a write intended for the flash data storage device while the flash data storage device was in read-only mode. In accordance with this option, data may be read directly from the flash data storage device in the read-only mode in response to the controller determining that the data has not been modified while the flash data storage device is in the read-only mode. For example, the controller may look into the list of major stripes were the parity strip was modified, and if the data to be read from the flash data storage device is not located in any of those major stripes then the data can be read directly from the flash data storage device as normal without any additional overhead. However, in response to the controller determining that the data was modified while the flash data storage device was in the read-only mode, the controller may use the modified parity stripe and data stored on other data storage devices in the same major stripe to regenerate the associated minor stripe for the flash data storage device. In other words, if the controller has listed the major stripe as having been modified, then the data actually stored on the associated minor stripe of the flash data storage device is considered stale or bad. But since the parity stripe was modified to reflect data intended to be written to that minor stripe of the flash data storage device, the data intended to be written can be regenerated in satisfaction of a read directed at that minor stripe. While regeneration of the data requires additional calculations or overhead, the foregoing operation allows the redundant array of independent disks to continue to perform read and write functions without loss of data even though the flash data storage device is in a read-only mode.

In another embodiment of the invention, the method may further include creating a back-up of one or more files by reading unmodified data stored on the flash data storage device and reading modified data stored on the device cache, storage controller cache, another data storage device within the array, or using parity to regenerate the data. In fact, the modified data may be read from any combination of the device cache, storage controller cache, another data storage device within the array, or using parity to regenerate the data.

In yet another embodiment, the method may include creating a copy of the entire flash data storage device onto a second data storage device by reading unmodified data stored on the flash data storage device and reading modified data stored on the device cache, storage controller cache, another data storage device within the array, or using parity to regenerate the data. In fact, the modified data may be read from any combination of the device cache, storage controller cache, another data storage device within the array, or using parity to regenerate the data. Optionally, the flash data storage device may be replaced with the second data storage device. When the second data storage device has replaced the flash data storage device, then any device cache, storage controller cache, or data storage device within the array that stored data associated with the flash data storage device may be deleted. It should be understood that the second data storage device may also be a second flash data storage device or other type of data storage, such as a hard disk drive.

In one option, the controller detects whether or not the flash data storage device is in read-only mode in response to a write error when writing to the flash data storage device. While the controller may detect whether or not the flash data storage device is in read-only mode prior to any write attempt, waiting for a write error prevents the overhead of performing this detection prior to every write to the flash data storage device. In a further option, the controller may, in response to a write error when writing to the flash data storage device and detecting that the flash data storage device is not in read-only mode, count the number of write errors incurred when writing to the flash data storage device. Subsequently, the controller may mark the flash data storage device as being defunct in response to the number of write errors exceeding a setpoint number of write errors.

In a further option, the method may further include, in response to the flash data storage device being in read-only mode, turning off background tasks of the computer system that would involve writing data to the flash data storage device. Turning off background tasks will have the effect of reducing the amount of data that will need to be written to empty space on other devices of the array, written to cache, or reflected in modification of parity.

A further embodiment of the present invention provides a computer program product for operating a redundant array of independent disks including a controller and a plurality of data storage devices, wherein the plurality of data storage devices includes a flash data storage device. The computer program product comprises a computer readable storage medium having program instructions embodied therewith, the program instructions executable by a processor to cause the processor to perform a method. The method in accordance with one embodiment may comprise communicating with a computer system that writes data to a redundant array of independent disks and reads data from the redundant array of independent disks, the controller detecting whether or not the flash data storage device is in read-only mode, and the controller preventing attempts to write data to the flash data storage device in response to detecting that the flash data storage device is in read-only mode.

The foregoing computer program products may further include computer readable program code for implementing or initiating any one or more aspects of the methods described herein. Accordingly, a separate description of the methods will not be duplicated in the context of a computer program product.

Figure 1:
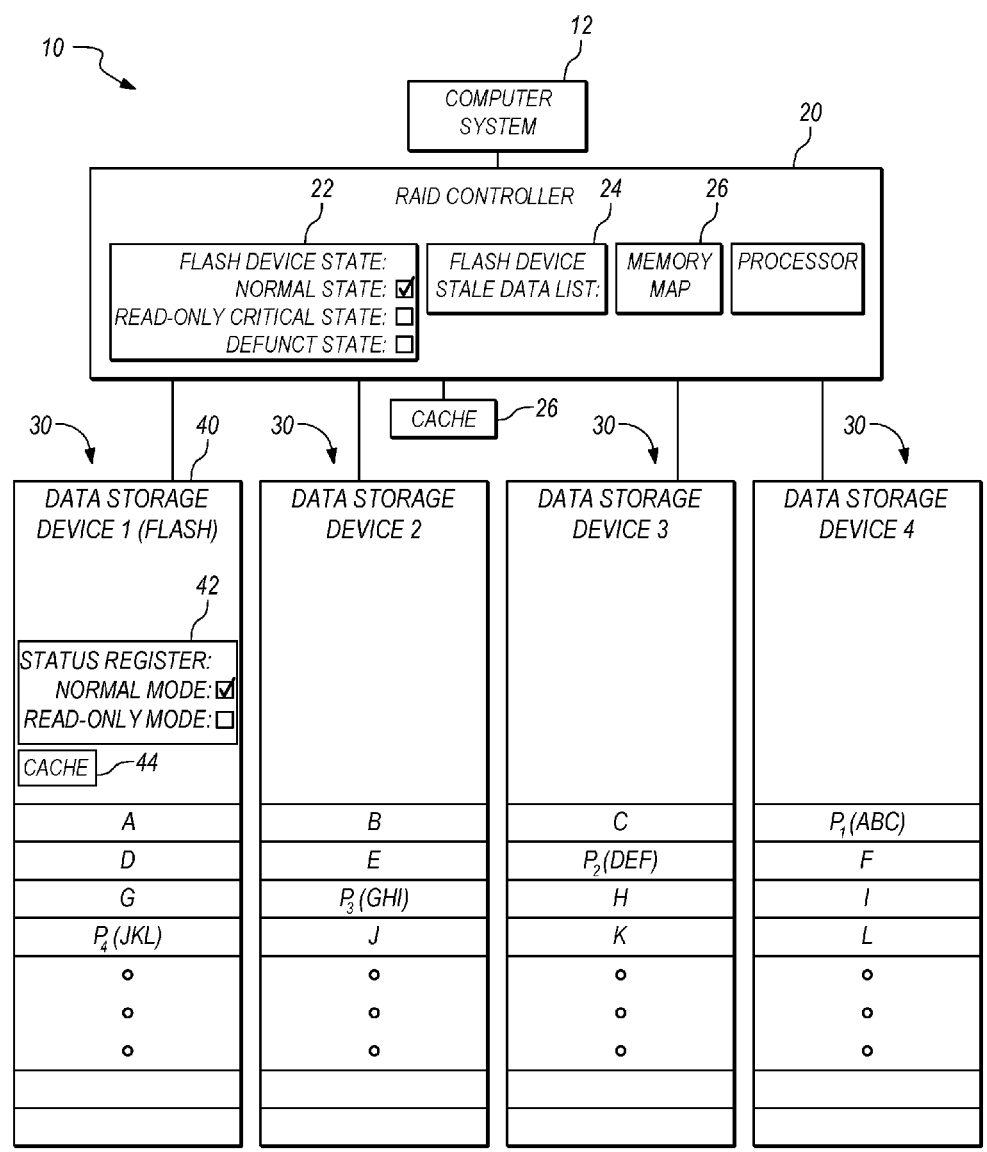
FIG. 1 is a diagram of a redundant array of independent disks (RAID) including a flash data storage device in accordance with one embodiment of the invention.

FIG. 1 is a diagram of a redundant array of independent disks (RAID) 10 including a flash data storage device in accordance with one embodiment of the invention. The redundant array of independent disks 10 includes a controller 20 and a plurality of data storage devices 30 that form the array. The controller 20 is connected for communication with a computer system 12 and is also connected for communication with each of the data storage devices 30 in the array. Preferably, the computer system 12 views the redundant array of independent disks 10 as a single logical entity and sends read and write instructions to the controller 20. It is the controller 20 that is responsible for managing how data is stored in major stripes across the array. The exact operation of the controller and the configuration of the array are effected by the number of data storage devices 30 that are available and the RAID level being implemented. The non-limiting example of a redundant array of independent disks 10 shown in FIG. 1 includes four data storage devices 30 being operated as a RAID level 5, which features block-level striping with distributed parity. For example, in the major stripe 1, data A is stored in a minor stripe on data storage device 1, data B is stored in a minor stripe on data storage device 2, data C is stored in a minor stripe on data storage device 3, and parity $P_1(ABC)$ is stored in a minor stripe on data storage device 4. The parity $P_1(ABC)$ is calculated using a predetermined parity calculation using the data A, data B and data C in the first major stripe as input. One example of a parity calculation is the exclusive-OR (XOR) of the data across the stripe. Other RAID levels may also incorporate the features of the present invention.

As shown, one of the data storage devices 30 is a flash data storage device 40. The flash data storage device 40 may include a register set 42 that indicates whether the flash data storage device 40 is in a normal mode or a read-only mode. In the normal mode, the controller 20 may read and write data anywhere on the device. In the read-only mode, the controller 20 can still read data anywhere on the device, but any attempt to write data to the device will result in a write error. In a preferred implementation, the controller 20 reads the registers 42 and stores an indication of the device mode in memory associated with controller 20. As shown, the controller 20 stores a table 22 indicating whether the flash data storage device 40 is currently in a normal mode/state, read-only mode/state, or a defunct state. The controller 20 is also shown storing a second table 24 that lists those minor stripes of the flash data storage device 40 have been modified since the flash data storage device 40 entered read-only mode. It should be recognized that, in the context of a flash data storage device that is in read-only mode, the term "modified" means that the data on the flash data storage device is stale or bad. In accordance with various embodiments, the "modified" data for the minor stripe may be stored in empty space on one of the other data storage devices 30, device cache memory 44, controller cache memory 26, or through recalculation of parity as described herein. Where the data is stored on one of the other data storage devices, device cache memory or controller cache memory, the controller stores the location of the data and the identity of the associated minor stripe in a memory map 26. While the other data storage devices 30 (i.e., device 2, device 3 and device 4) may be hard disk drives or other types of data storage, the invention encompasses embodiments where the plurality of data storage devices 30 in the array 10 are all flash data storage devices.

Figure 2:
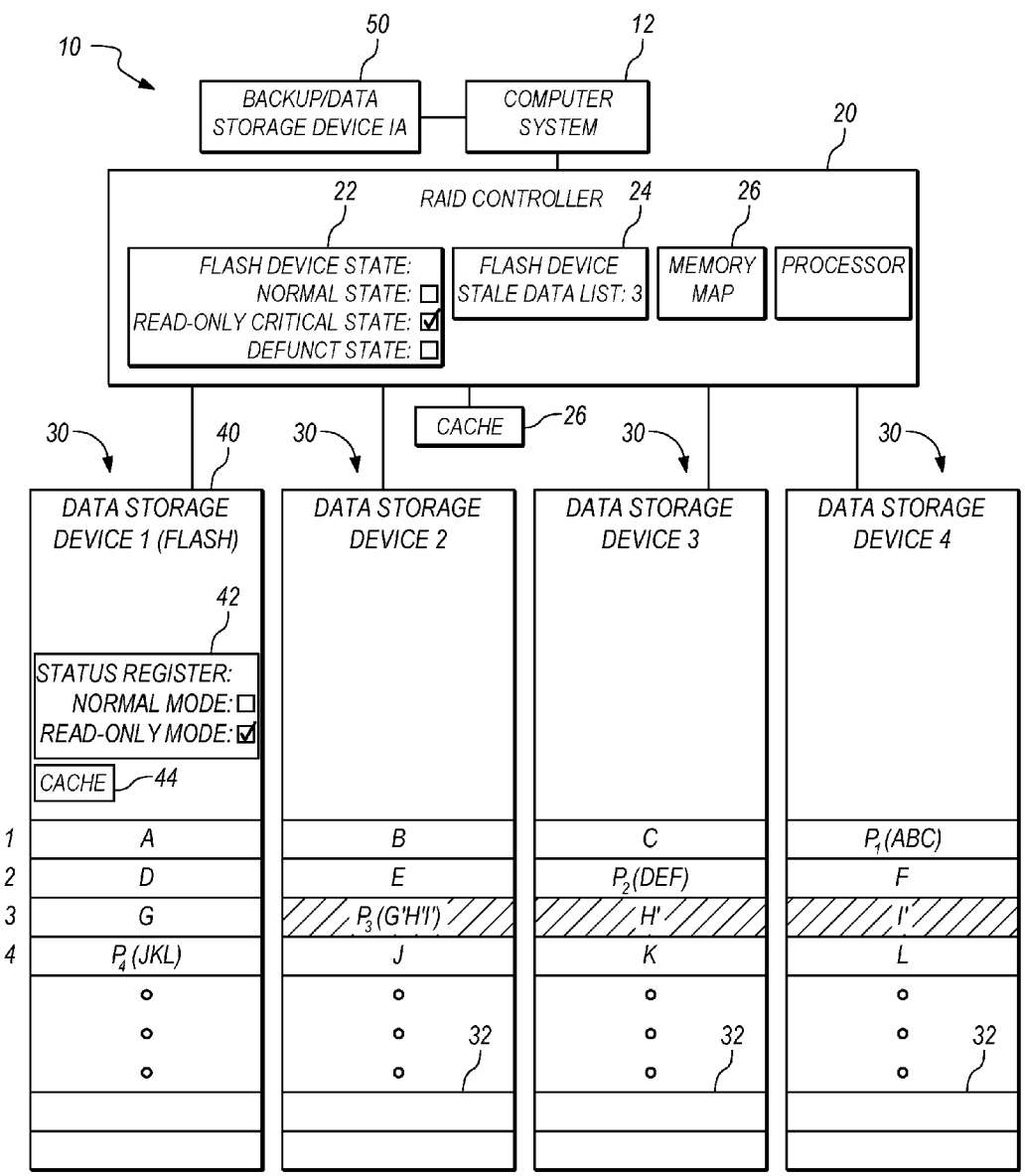
FIG. 2 is a diagram of a redundant array of independent disks (RAID) including a flash data storage device in read-only mode in accordance with one embodiment of the invention.

FIG. 2 is a diagram of the redundant array of independent disks (RAID) 10 including the flash data storage device 40 in read-only mode in accordance with one embodiment of the invention. As shown, the flash data storage device 40 has changed its status register set 42 to indicate that it is now in read-only mode. The controller 20 has read the status register set 42 and stores the table 22 with an indication that the flash data storage device is in a read-only critical state. The "read-only critical state" indicates that the flash memory device is in a read-only mode and that the controller is taking steps to continue reading and writing data to the array 10 without actually writing data to the flash data storage device 40.

In the example of FIG. 2, the controller 20 needs to store data in the minor strip G in the major stripe 3. However, since the flash data storage device 40 is in the read-only critical state, the controller 20 avoids writing data to the flash data storage device 40. Rather, the controller 20 may store the data in empty space 32 on one of the other data storage devices 30, device cache memory 44, controller cache memory 26, or through recalculation of parity $P_3(GHI)$ to $P_3(G'H'I')$ as described herein. When storing the data to another data storage device or cache memory, the controller 20 will map that data to the intended minor stripe G of the flash data storage device, such that any subsequent read instruction directed at the minor stripe G will be satisfied with data from the relevant portion from the other data storage device or cache memory. When using a parity modification or recalculation, the non-parity minor stripes on the other data storage devices 30 (i.e., device 3 and device 4) are written as normal, and the parity minor stripe (i.e., device 2) is calculated using the current data H' on device 3, the current data I' on device 4 and the data (G') that was intended to be written over minor stripe G. After P₃(G'H'I') has be calculated and stored in device 2, then the controller can purge its memory of the data G' intended to be written to minor stripe G.

Note that in major stripe 4, the minor stripe on the flash data storage device 40 stores the parity P₄(JKL). In the event that one of the other data storage devices were to fail, the controller 20 can still read this parity P₄(JKL) in order to rebuild the failed device. If the data in any of the minor stripes J, K or L are modified, then the parity should be recalculated. In this instance, since the recalculated parity cannot be written to the flash data storage device 40, the controller may store the recalculated parity in empty space 32 on one of the other data storage devices 30, device cache memory 44, or controller cache memory 26.

A further data storage device 50 (i.e., data storage device 1A) may be provided in order to backup the content of the read-only flash data storage device 40, perhaps so that the further data storage device 50 can replace the flash data storage device 40 that is in a read-only state. In order to make the backup, the controller 20 will use its stored map to identify the location of any data mapped to the flash data storage device 40, and copies the data from those locations to the relevant minor stripe of the data storage device 50. This may involve reading data stored in previously empty space 32 on one of the other data storage devices 30, device cache memory 44, or controller cache memory 26. Furthermore, when the controller 20 recalculated parity rather than write the minor stripe data intended for the flash memory in another location, then the controller 20 must read the minor stripes of the other data storage devices 30 (i.e., device 2, device 3 and device 4) and use the same function as the parity calculation (i.e., XOR) to determine what data was intended to be written to the flash data storage device 40. The data so determined in then written to the backup data storage device 50 in the appropriate minor stripe.

Figure 3:
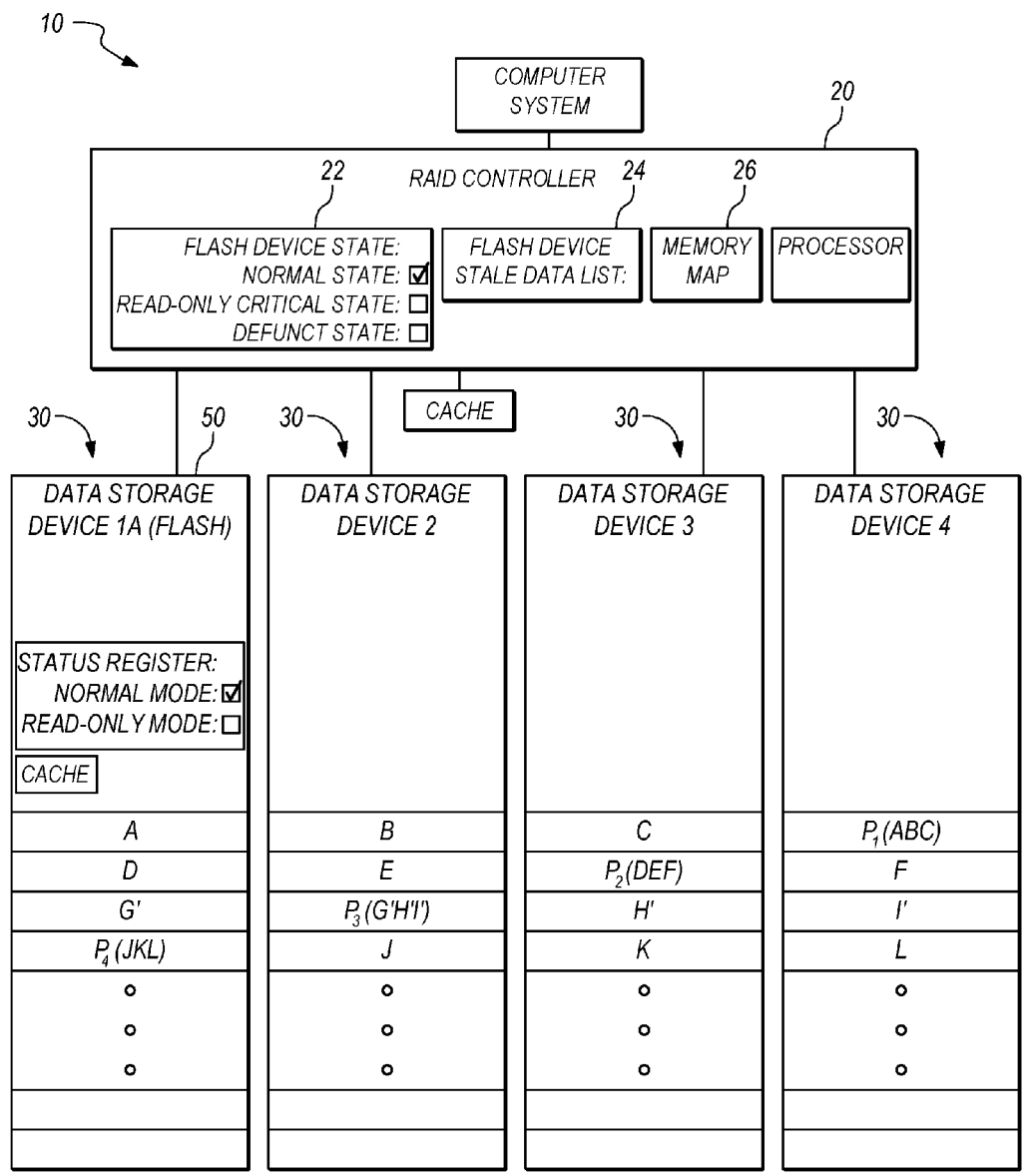
FIG. 3 is a diagram of a redundant array of independent disks (RAID) including a replacement flash data storage device with updated data in accordance with one embodiment of the invention.

FIG. 3 is a diagram of the redundant array of independent disks (RAID) 10 including the new data storage device 50 with updated/current data replacing the read-only flash data storage device 40. Since data can be written to the new data storage device 50 (i.e., it is in normal mode, not read-only mode), the controller 20 changes its table 22 to indicate that the new data storage device 50 is in a normal state. Accordingly, the controller 20 may read and write data to the entire array as normal. Note that the new data storage device 50 now stores the data G'. Furthermore, the controller can delete or reuse memory locations on the other data storage devices or cache memory that were previously used to stored data that could not be written to the read-only flash data storage device 40.

FIGS. 4A-B provide a flowchart of one embodiment of a method 60 for handling read and write operations involving a flash data storage device in a redundant array of independent disks (RAID). The method preferably allows the read-only flash data storage device to be kept from being marked defunct without hurting the data integrity of the array.

In step 62, the method determines whether the flash data storage device is in a "read-only critical" state. If the flash data storage device is not in the "read-only critical" state, then the method proceeds (i.e., follows the "No" branch) to step 64 where the method determines whether the intended operation is a read from the flash device or a write to the flash device. If the intended operation is a read from the flash device, then the method proceeds (i.e., follows the "read" branch) to step 66, where the method reads the minor stripe from the flash device as normal. Since the read function is completed, the method ends. Should another read or write be requested, then the method may begin again.

If step 64 determines that the intended operation is a write to the flash device, then the method proceeds (i.e., follows the "write" branch) to step 68, where the method attempts to write to the flash device. Step 70 then determines whether there was a write error during the attempted write. If there was no write error, then the method ends. However, if step 70 determines that there was a write error, then the method proceeds to step 72 to determine if the flash device is in "read-only" mode. If the flash device is determined to be in read-only mode, then in step 74, the controller stores an indication that the flash device in a "read-only critical" state, such that additional procedures are executed in accordance with the present invention. After step 74, the method proceeds to FIG. 4B (see connecting point "B").

If step 72 determines that the flash device is not in "read-only" mode, then step 76 determines whether the number of write errors associated with the current write instruction is greater than a setpoint number of write errors. If step 76 reaches a positive determination, then step 78 marks the flash device as being defunct. Alternatively, if step 76 reaches a negative determination, then step 80 performs a normal write-error process before returning to step 70 to determine whether the next attempted write incurs a write error.

Referring back to step 62, if the method determines that the flash data storage device is in the "read-only critical" state, then the method proceeds (i.e., follows the "Yes" branch) to step 82 where the method determines whether the intended operation is a read from the flash device or a write to the flash device. If the intended operation is a write operation then the method proceeds to FIG. 4B (see connecting point "B"). However, if step 82 determines that the intended operation is a read operation, then step 84 determines whether the minor stripe has been previously listed as being modified. Note that the list of "modified" minor stripes only includes minor strips that were "modified" after the flash data storage device entered the read-only mode. Accordingly, the "modified" list means that the data associated with the minor stripe is stored on one of the other data storage devices 30, device cache memory 44, or controller cache memory 26, or that the controller may recalculate the desired data using the data and parity minor stripes within the same major stripe across the array. If the minor stripe is not listed as modified, then step 86 reads the minor strip from the flash device as normal. If the minor stripe is listed as having been modified, then step 88 regenerates the minor strip using parity and data on other data storage device as previously described. Alternatively or in combination with regeneration the data, the method may use a map to identify another location where the data was stored in association with the minor stripe. If step 82 determines that the intended operation is a write operation, then the method proceeds to FIG. 4B (see connecting point "B").

Continuing from either of step 74 or step 82, FIG. 4B describes steps for handling a write operation for a minor stripe on a flash data storage device that is in "read-only" mode. In step 90, the method determines if there is available data storage space available on the other data storage devices in the array. If so, step 92 stores the data on the other data storage devices and step 94 stores a list of locations where each minor stripe has been stored. This list of location is needed for subsequent read operations. If there is insufficient data storage space available on the other data storage devices per step 90, then step 96 determines if there is sufficient available data storage space available in the device cache or the controller cache. If so, then step 98 stores the data in the available cache and step 94 stores a list of cache locations where each minor stripe has been stored. If there is insufficient data storage space available in cache per step 96, then step 100 modifies the major stripe parity as if the data were written to the flash device. Step 102 stores a list of major stripes where the parity has been modified to reflect the data that was intended to be written to the read-only flash data storage device.

As will be appreciated by those skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention may be described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, and/or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method, comprising:
   receiving, by a processor operatively coupled to a redundant array of independent disks, data and a request to store the data on the redundant array of independent disks, wherein the redundant array of independent disks includes a plurality of data storage devices, and wherein the plurality of data storage devices includes a flash data storage device;
   the processor detecting whether or not the flash data storage device is in read-only mode;
   the processor preventing the data from being written to the flash data storage device in response to detecting that the flash data storage device is in read-only mode;
   the processor modifying the parity stripe of a major stripe as if the data was written to the flash data storage device that is in read-only mode; and
   the processor storing a list of each parity stripe that has been modified while the flash data storage device is in read-only mode.

2. The method of claim 1, further comprising:
   receiving, by the processor, a request to read the data from the redundant array of independent disks;
   reading the data directly from the flash data storage device in the read-only mode in response to the processor determining that the data has not been modified while the flash data storage device is in the read-only mode; and
   using the modified parity stripe and data stored on other data storage devices in the same major stripe to regenerate the data in response to the processor determining that the parity stripe was modified while the flash data storage device was in the read-only mode.

3. The method of claim 1, further comprising:
   creating a back-up of one or more files by reading a combination of unmodified data stored on the flash data storage device and modified data stored on the device cache, storage controller cache, another data storage device within the array, or using parity to regenerate the data.

4. The method of claim 1, further comprising:
   creating a copy of the entire flash data storage device onto a second data storage device by reading a combination of unmodified data stored on the flash data storage device and modified data stored on the device cache, storage controller cache, another data storage device within the array, or using parity to regenerate the data; and
   replacing the flash data storage device with the second data storage device.

5. The method of claim 1, wherein the step of the processor detecting whether or not the flash data storage device is in read-only mode is performed in response to a write error when writing to the flash data storage device.

6. The method of claim 5, further comprising:
   in response to a write error when writing to the flash data storage device and detecting that the flash data storage device is not in read-only mode, the processor counting the number of write errors incurred when writing to the flash data storage device; and
   the processor marking the flash data storage device as being defunct in response to the number of write errors exceeding a setpoint number of write errors.

7. The method of claim 1, further comprising:
   the processor treating the flash data storage device as being defunct only if the flash data storage device is not in read-only mode and the number of write errors exceeds a setpoint number of write errors.

8. The method of claim 1, wherein the plurality of data storage devices includes at least one hard disk drive.

9. The method of claim 1, wherein the flash data storage device includes a register set that stores an indication whether or not the flash storage device is in read-only mode.

10. The method of claim 1, further comprising:
    turning off background tasks of the computer system that would involve writing data to the flash data storage device in response to the flash data storage device being in read-only mode.

11. The method of claim 1, wherein the redundant array of independent disks stores an operating system that is used by the processor to which the redundant array of independent disks is operatively coupled.

12. A computer program product for controlling a redundant array of independent disks including a plurality of data storage devices, wherein the plurality of data storage devices includes a flash data storage device, the computer program product comprising a computer readable storage medium that is not a transitory signal having program instructions embodied therewith, the program instructions executable by a processor to:
    receive data and a request to store the data to the redundant array of independent disks;
    detect whether or not the flash data storage device is in read-only mode;
    prevent the data from being written to the flash data storage device in response to detecting that the flash data storage device is in read-only mode;
    modify the parity stripe of a major stripe as if the data was written to the flash data storage device that is in read-only mode; and
    store a list of each parity stripe that has been modified while the flash data storage device is in read-only mode.

13. The computer program product of claim 12, wherein the program instructions are further executable by the processor to:

receive a request to read the data from the redundant array of independent disks;
read the data directly from the flash data storage device in the read-only mode in response to the controller determining that the data has not been modified while the flash data storage device is in the read-only mode; and
use the modified parity stripe and data stored on other data storage devices in the same major stripe to regenerate the data in response to the controller determining that the parity stripe was modified while the flash data storage device was in the read-only mode.

14. The computer program product of claim 12, wherein the program instructions are further executable by the processor to:
create a back-up of one or more files by reading a combination of unmodified data stored on the flash data storage device and modified data stored on the device cache, storage controller cache, another data storage device within the array, or using parity to regenerate the data.

15. The computer program product of claim 12, wherein the program instructions are further executable by the processor to:
turn off background tasks of the computer system that would involve writing data to the flash data storage device in response to the flash data storage device being in read-only mode.

16. An apparatus, comprising:
a redundant array of independent disks including a plurality of data storage devices, wherein the plurality of data storage devices includes a flash data storage device;
at least one storage device for storing program instructions; and
at least one processor for processing the program instructions to:
receive data and a request to store the data to the redundant array of independent disks;
detect whether or not the flash data storage device is in read-only mode;
prevent the data from being written to the flash data storage device in response to detecting that the flash data storage device is in read-only mode;
modify the parity stripe of a major stripe as if the data was written to the flash data storage device that is in read-only mode; and
store a list of each parity stripe that has been modified while the flash data storage device is in read-only mode.

17. The apparatus of claim 16, the at least one processor for further processing the program instructions to:
receive a request to read the data from the redundant array of independent disks;
read the data directly from the flash data storage device in the read-only mode in response to the controller determining that the data has not been modified while the flash data storage device is in the read-only mode; and
use the modified parity stripe and data stored on other data storage devices in the same major stripe to regenerate the data in response to the controller determining that the parity stripe was modified while the flash data storage device was in the read-only mode.

18. The apparatus of claim 16, the at least one processor for further processing the program instructions to:
create a back-up of one or more files by reading a combination of unmodified data stored on the flash data storage device and modified data stored on the device cache, storage controller cache, another data storage device within the array, or using parity to regenerate the data.

19. The apparatus of claim 16, the at least one processor for further processing the program instructions to:
turn off background tasks of the computer system that would involve writing data to the flash data storage device in response to the flash data storage device being in read-only mode.

20. The apparatus of claim 16, wherein the flash data storage device includes a register set that stores an indication whether or not the flash storage device is in read-only mode.

* * * * *